United States Patent [19]

Coleman

[11] Patent Number: 4,785,233
[45] Date of Patent: Nov. 15, 1988

[54] METHOD AND APPARATUS FOR TESTING ELECTRICAL EQUIPENT

[75] Inventor: Raymond L. Coleman, Cheshire, England

[73] Assignee: Era Patents Limited, England

[21] Appl. No.: 89,076

[22] Filed: Aug. 25, 1987

[30] Foreign Application Priority Data

Aug. 26, 1986 [GB] United Kingdom ............... 8620658

[51] Int. Cl.$^4$ .......................................... G01R 27/16
[52] U.S. Cl. ................................................ 324/57 SS
[58] Field of Search .............. 324/57 SS, 78 N, 77 CS

[56] References Cited

U.S. PATENT DOCUMENTS

| | | | |
|---|---|---|---|
| 3,904,959 | 9/1975 | Britton, Jr. | 324/57 SS |
| 4,007,423 | 2/1977 | Dickinson | 324/77 CS |
| 4,424,480 | 1/1984 | Stefan | 324/60 C |
| 4,533,866 | 8/1985 | Zirwick | 324/77 CS |

Primary Examiner—Reinhard J. Eisenzopf
Assistant Examiner—Maura K. Regan
Attorney, Agent, or Firm—Larson & Taylor

[57] ABSTRACT

In a method of testing electrical equipment having inherent stray impedances while the equipment is connected to a conductor a swept sinusoidal signal is injected and the response of the equipment to the signal analysed. In order to prevent current flow within the conductor affecting the results of the analysis a nulling signal is injected to nullify the current which would otherwise flow in the conductor as a result of the application of the swept-frequency signal. In a preferred embodiment the phase and amplitude of currents in the conductor and in the line through which nulling signals are injected are compared. The phase and amplitude of the nulling signal are adjusted in accordance with the result of these comparisons.

10 Claims, 1 Drawing Sheet

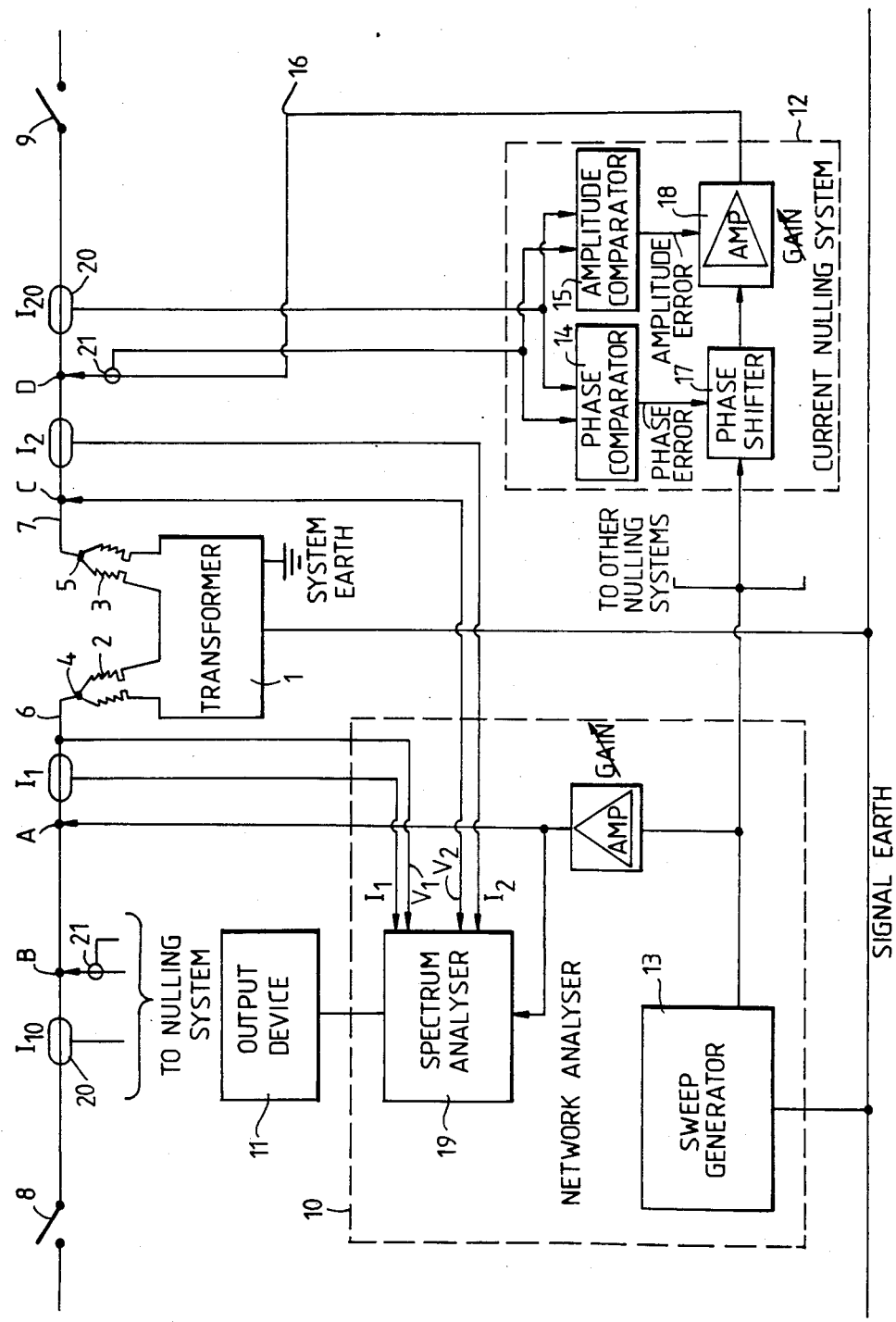

METHOD AND APPARATUS FOR TESTING ELECTRICAL EQUIPENT

BACKGROUND OF THE INVENTION

This invention relates to a method and apparatus for testing electrical equipment, and particularly for monitoring the condition of large transformers during the course of their lives in service.

It is known that while large transformers, such as those connected to the electricity supply network, are in service, shifting of their windings can occur. This is a condition which must be recognised, and dealt with, without undue delay, which means that the integrity of the transformers must be continually monitored.

Such monitoring is currently achieved by the use of repetitive surge oscillograms (RSO). This is a technique which monitors the responses of stray impedances in the transformer to an applied pulse. It relies on the exact reproduction of both the physical conditions under which successive tests are carried out, e.g. the cable lengths and positions, and on the electrical conditions, such as the shape and amplitude of the successive applied pulses. The technique produces an initial "fingerprint" of the transformer, and any subsequent shifting of the transformer windings will change the fingerprint. This change will be revealed by the next test.

Alternatively, however, an anomaly in a transformer can be revealed by comparing the responses of a number of similar transformers, in tests performed under identical conditions.

In each case, the stray inductances and capacitances of the transformer are being 'interrogated' by the applied time domain pulses to establish geometric spacings of the windings. Whilst the exact geometric spacings are not quantifiable in absolute terms, relative spacings are observable.

Although the RSO technique can successfully show up problems of winding movement, it has a number of serious drawbacks. Firstly, the transformer to be tested must be physically disconnected from the network so that the capacitance and inductance of network conductors do not affect the measurements. This means disconnecting the network as close to the transformer as possible, i.e. at the transformer bushings. When each test has been performed, the network must be reconnected without delay, and the connections must be thoroughly tested. This procedure has to be repeated for each successive test. It will be apparent that the disconnection and subsequent reconnection of the transformer must be subject to very stringent safety procedures.

Secondly, it is essential that the electrical conditions in successive tests be identical to those of the previous tests. This exact reproduction of test conditions is very difficult to achieve. Furthermore, the tests require the provision of dedicated shunts, cables and spatial diagrams.

Thirdly, having produced the oscillograms as a result of the application of the test pulses, the meaning of those oscillograms must be interpreted. Determination of whether the oscillograms indicate shifting of windings requires considerable expertise.

Such testing is therefore very manpower intensive. Working in the time domain causes problems of repeatability of the test conditions, and also means that a single shot approach is adopted.

An object of the present invention is to provide an improved method and apparatus for monitoring the condition of transformers and other electrical equipment.

SUMMARY OF THE INVENTION

According to one aspect of the invention, a method of testing electrical equipment having inherent stray impedances the values of which vary as a result of an occurrence in the equipment, the equipment being connected to a conductor not forming part of the equipment, comprises applying to the equipment a probe signal of substantially sinusoidal waveform and of frequency which is swept over a predetermined frequency range; feeding to the conductor a nulling signal to nullify a current which would otherwise flow in the conductor as a result of the application of the swept-frequency signal to the equipment; analysing the response of the equipment to the swept-frequency probe signal to determine frequencies at which specific responses are produced as a result of the values of the stray impedances; and comparing the result of the analysis with expected values for the equipment.

According to another aspect of the invention, apparatus for testing electrical equipment having inherent stray impedances the values of which can vary as a result of an occurrence in the equipment, the equipment being connected to a conductor not forming part of the equipment, the apparatus comprising means to apply to the equipment a probe signal of substantially sinusoidal waveform; means to sweep the frequency of the probe signal over a predetermined frequency range; means to monitor current flowing in the conductor as a result of application of the swept-frequency signal; means to feed to the conductor a nulling signal to maintain the value of the monitored current substantially at zero; and means to analyse the response of the equipment to the swept-frequency signal to determine frequencies at which specific responses are produced as a result of the values of the stray impedances.

By use of the invention, the external conductor is effectively disconnected from the equipment for the purposes of the test.

The electrical equipment may be a transformer, the stray impedances in which can vary as a result of shifting of the windings of the transformer.

BRIEF DESCRIPTION OF THE DRAWINGS

The FIGURE of the drawing is a schematic block diagram of a testing apparatus in accordance with the invention.

DETAILED DESCRIPTION

Referring to the block diagram, a transformer 1 to be tested while in service includes bushings 2 and 3 through which emerge terminals 4 and 5 to which respective windings of the transformer are connected. Conductors 6 and 7 are connected to the terminals, and these conductors are connected to supply or utilisation networks (not shown) via respective isolators 8 and 9. For the duration of the testing procedure the isolators are temporarily opened.

Test equipment, which is temporarily connected to the conductors 6 and 7, comprises a network analyser 10 including a sweep generator 13 and a spectrum analyser 19. The sweep generator 13 is capable of applying to the conductor 6 a substantially sinusoidal voltage, the frequency of which is swept cyclically over a range of, say, 10 kHz to 1 MHz at a predetermined rate. The voltage applied to the conductor 6, and hence to its respective transformer winding, results in the production of an output voltage at the terminal 5, as a result of the transformer impedance. This output voltage is fed back to the spectrum analyser 19 for analysis of its waveform. The result of the analysis is fed to an output device 11, which may comprise an X-Y plotter which will produce a print-out of the analysis result.

Due to the various inductive and capacitive reactances in the transformer, resonant peaks and troughs will be produced in the relative gain measured by the network analyser between the amplitude of the output voltage and the applied voltage as the input voltage is swept through its range. Corresponding variations in the relative phase of the output and applied voltage will also be produced. These variations in gain and phase act as a "fingerprint" for the transformer.

In the frequency domain, using sinusoidal waveforms, the parameters of interest are the relative gain (or attenuation) of the transformer, and the corresponding phase shift of the signal and neither of these two parameters is difficult to measure. If the transformer is visualised as being open circuit at its bushings, the injection and measurement of these signals is not dependent upon creating exact reproductions of earlier tests. Furthermore, since the sine waves can be maintained indefinitely, there is no problem of measuring the responses accurately. This should be compared with the single shot procedure of the time domain approach.

The present swept-frequency sinusoidal method successfully removes the requirement for exact reproduction of previous tests, and enables the data to be acquired with the desired degree of accuracy across the required frequency spectrum. Furthermore, since any change in the geometry of the transformer inevitably changes the values of the stray impedances, the resonant peaks and troughs shift in frequency. This change is immediately apparent, and the amount of shift is related to the size of physical movement.

The problem of keeping the conductors 6 and 7 connected to the transformer 1 while making the tests complicates matters, in that the impedances applied to the transformer by those conductors, the isolators and any other equipment connected to it affect the absolute value of the applied sinusoidal voltage and its phase shift. The requirement is therefore to create conditions such that the measuring equipment does not 'see' anything other than the transformer. This can be accomplished by measuring the current in the conductors, and injecting secondary signals into the conductors to null these undesired currents. Under these conditions, with zero current in the conductors, the transformer 1 and the measuring equipment behave as if they were totally isolated, even though the conductors etc. are still connected.

For this purpose, the measuring equipment includes a current nulling system 12. The current nulling system 12 includes a phase comparator 14 and an amplitude comparator 15. Each comparator receives an input from a sensor 21 on a line 16 through which the nulling signal is injected and a sensor 20 on conductors 6, 7. The phase comparator 14 outputs a phase error signal which drives a phase shifter 17. The amplitude comparator 15 outputs an amplitude error signal which drives a variable gain amplifier 18. The phase shifter 17 and the variable gain amplifier 18 vary the phase and amplitude of the sinusoidal signal taken from the sweep-frequency oscillator 13 to provide the nulling signal injected into conductors 6, 7 via the nulling signal line 16. A separate current nulling system 12 is provided for each conductor 6, 7.

The voltage signal from the sweep generator is injected at a point A on the conductor 6, the point being physically very close to the transformer bushing terminal 4. If a voltage signal is injected by the system 12 at a point B with an amplitude and a phase equal to that at the point A, there is no current flow between A and B. This corresponds to an open circuit between these two points, and the input transformer bushing terminal 4 is therefore virtually disconnected from the external circuit. Similarly if a voltage at a point D is made equal in amplitude and phase to the voltage at a point C on the conductor 7, there is no current flow between these two points, so that the terminal 5 is effectively disconnected from the external circuit.

For a star-star connected transformer, there are a total of eight terminals (i.e. 3 phase terminals and a neutral terminal for each winding). Six independent voltage injections on the respective conductors (not shown) in addition to the two for the tested terminals 4 and 5, are required to eliminate any current flow in those six conductors. With appropriate tracking of the sweep generator frequency and independently controlled injection voltages (both in magnitude and phase angle) to all of the transformer terminals, the shunting effect due to the externally-connected conductors is eliminated. Under these conditions, with zero currents in all external circuits, the transformer and measuring circuits behave as if they are totally isolated and the described procedure for frequency response testing can be carried out unhindered.

Although the above embodiment has been described in relation to transformer testing, the method and apparatus can be applied to other electrical equipment, such as power lines or generators, which would exhibit changes in stray impedances as a result of damage or other occurrences.

I claim:

1. An apparatus for testing an electrical system comprising electrical equipment having inherent stray impedances and conductor means connected to said equipment, said apparatus testing said electric system by detecting values of said inherent stray impedances in said equipment which are indicative of the state of said equipment, said apparatus comprising:

probe signal applying means arranged to be operatively connected to said conductor means adjacent said equipment and to apply a probe signal of substantially sinusoidal waveform;

frequency sweeping means operatively connected to said probe signal applying means to sweep said probe signal over a predetermined frequency range;

current monitoring means arranged to be operatively coupled with said conductor means remote from said equipment to monitor current flowing in said conductor means as a result of said application of said probe signal;

nulling signal feed means arranged to be operatively connected to said conductor means remote from said equipment to feed a nulling signal to said conductor means to nullify said current flowing in said conductor means; and, analyser means arranged to be operatively connected to said conductor means adjacent said equipment to analyse a response of said equipment to said probe signal to determine frequencies at which specific responses are produced as the result of said values of said stray impedances of said equipment whereby effects of impedance of said conductor means are eliminated.

2. An apparatus according to claim 1, wherein said nulling signal feed means includes a phase comparator and an amplitude comparator, said phase comparator and said amplitude comparator producing respective outputs, a nulling signal line arranged to be operatively coupled to said conductor means remote from said equipment, and output means to output via said nulling signal line a nulling signal controlled in dependence upon said outputs of said phase comparator and said amplitude comparator.

3. An apparatus according to claim 2, wherein said amplitude comparator is arranged to compare amplitudes of currents in said conductor means and said nulling signal line, said phase comparator is arranged to compare phases of currents in said conductor means and in said nulling signal line, and said output means comprise a phase shifter operatively connected to and driven by said output of said phase comparator and arranged to control phase of said nulling signal and a variable gain amplifier operatively connected to said phase shifter and operatively connected to and driven by said output of said amplitude comparator and arranged to control said amplitude of said nulling signal.

4. An apparatus according to claim 1, wherein said frequency sweeping means is operatively connected to and arranged to output a signal to both said probe signal applying means and to said nulling signal feed means.

5. An apparatus according to claim 4, wherein said nulling signal feed means include a phase comparator and an amplitude comparator, said phase comparator and said amplitude comparator producing respective outputs, a nulling signal line arranged to be operatively coupled to said conductor means remote from said equipment, and operatively connected to said frequency sweeping means output means to output via said nulling signal line a nulling signal controlled in dependence upon said outputs of said phase comparator and said amplitude comparator.

6. An apparatus according to claim 5, wherein said amplitude comparator is arranged to compare amplitudes of currents in said conductor means and said nulling signal line, said phase comparator is arranged to compare phases of currents in said conductor means and in said nulling signal line, and said output means comprise a phase shifter operatively connected to and driven by said output of said phase comparator and arranged to control phase of said nulling signal and a variable gain amplifier operatively connected to said phase comparator and operatively connected to and driven by said output of said amplitude comparator and arranged to control said amplitude of said nulling signal.

7. A method of testing an electrical system comprising electrical equipment having inherent stray impedances and conductor means connected to said equipment, said method detecting values of said inherent stray impedances in said equipment which are indicative of the state of said equipment, said method comprising the steps of:

applying to said conductor means adjacent said equipment a probe signal of substantially sinusoidal waveform;

sweeping said probe signal over a predetermined frequency range;

feeding to said conductor means remote from said equipment a nulling signal arranged to nullify a current flowing in said conductor as a result of applying said probe signal and thereby eliminating effects of impedance of said conductor means;

analysing a response of said equipment to said probe signal by determining frequencies at which specific responses are produced as a result of said values of said stray impedances; and, comparing results of said analysis with expected values of said stray impedances of said equipment thereby determining said state of said equipment.

8. A method according to claim 7, including the steps of detecting phases and amplitudes of currents in said conductor means and controlling said nulling signal in dependence upon said phases and amplitudes.

9. A method according to claim 8, including the steps of comparing phases of currents in said conductor means and in a line feeding said nulling signal to said conductor means;

comparing amplitudes of currents in said conductor means and in said line;

controlling phase of said nulling signal in dependence upon results of said comparison of current phases; and, controlling amplitude of said nulling signal in dependence upon results of said comparison of said amplitudes.

10. A method according to claim 9, including the steps of generating a substantially sinusoidal signal;

dividing said signal into said probe signal and a frequency reference signal; and, modulating said frequency reference signal in dependence upon said results of said comparisons of phases and amplitudes to form said nulling signal.

* * * * *